(12) United States Patent
Rosmeulen et al.

(10) Patent No.: US 10,972,688 B2
(45) Date of Patent: Apr. 6, 2021

(54) PIXEL ARCHITECTURE AND AN IMAGE SENSOR

(71) Applicant: IMEC VZW, Leuven (BE)

(72) Inventors: Maarten Rosmeulen, Ghent (BE); Andreas Suss, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/511,799

(22) Filed: Jul. 15, 2019

(65) Prior Publication Data

US 2020/0021758 A1 Jan. 16, 2020

(30) Foreign Application Priority Data

Jul. 16, 2018 (EP) .................................... 18183652

(51) Int. Cl.
*H04N 5/357* (2011.01)
*H01L 27/146* (2006.01)
*H04N 5/378* (2011.01)

(52) U.S. Cl.
CPC ....... *H04N 5/3575* (2013.01); *H01L 27/1464* (2013.01); *H01L 27/14612* (2013.01);
(Continued)

(58) Field of Classification Search
CPC ................. H04N 5/3575; H04N 5/378; H01L 27/14612; H01L 27/14621;
(Continued)

(56) References Cited

U.S. PATENT DOCUMENTS

2011/0089471 A1   4/2011  Buettgen et al.
2011/0187908 A1*  8/2011  Kawahito ......... H01L 27/14603
                                              348/306
(Continued)

FOREIGN PATENT DOCUMENTS

EP   2 816 601 A     12/2014
WO   2018/029369 A1   2/2018

OTHER PUBLICATIONS

European Search Report, European Patent Application No. 18183652.9, dated Jan. 22, 2019, 8 pages.
(Continued)

*Primary Examiner* — Padma Haliyur
(74) *Attorney, Agent, or Firm* — McDonnell Boehnen Hulbert & Berghoff LLP

(57) ABSTRACT

A pixel architecture comprises: an absorption layer, which is configured to generate charges in response to incident light; a semiconductor charge-transport layer, which is configured to transport the generated charges through the charge-transport layer, wherein one or more doped regions are arranged in the charge-transport layer, wherein the charge-transport layer comprises a bias region and a charge-dispatch region being associated with the bias region; an electric connection connecting to and providing a selectable bias voltage to the bias region; and at least one transfer gate, wherein the doped regions and the bias region are differently biased for driving transport of the generated charges towards the charge-dispatch region, and for controlling, together with the at least one transfer gate, transfer of charges from the charge-dispatch region to a charge node.

20 Claims, 5 Drawing Sheets

(52) U.S. Cl.
CPC .. *H01L 27/14621* (2013.01); *H01L 27/14627* (2013.01); *H01L 27/14636* (2013.01); *H04N 5/378* (2013.01)

(58) Field of Classification Search
CPC ......... H01L 27/14627; H01L 27/14636; H01L 27/1464; H01L 27/1461; H01L 27/14605; H01L 27/14601
See application file for complete search history.

(56) References Cited

U.S. PATENT DOCUMENTS

| | | | |
|---|---|---|---|
| 2013/0201167 A1* | 8/2013 | Oh ................... | H01L 27/14656 345/207 |
| 2014/0085727 A1* | 3/2014 | Chen ..................... | G02B 5/288 359/589 |
| 2015/0069471 A1* | 3/2015 | Kawamura ....... | H01L 27/14605 257/228 |
| 2017/0111603 A1 | 4/2017 | Hynecek | |
| 2019/0214428 A1* | 7/2019 | Nagaraja .................. | H04N 5/33 |

OTHER PUBLICATIONS

Seo, Min-Woong et al., "A 10 ps Time-Resolution CMOS Image Sensor With Two-Tap True-CDS Lock-In Pixels for Fluorescence Lifetime Imaging", IEEE Journal of Solid-State Circuits, vol. 51, No. 1, Jan. 2016, pp. 141-154.

Dao, V.T.S. et al., "Toward 10 Gfps: Factors Limiting the Frame Rate of the BSI MCG Image Sensor", In Proceedings of the International Image Sensor Workshop, Vaals, The Netherlands, 2015, 4 pages.

Morikawa, Yuki et al., "A Lateral Electric Field Charge Modulator With Bipolar-Gates for Time-Resolved Imaging", Society for Imaging Science and Technology, 2017, pp. 64-67.

Eton, Takeharu G. et al., "Toward One Giga Frames Per Second— Evolution of in Situ Storage Image Sensors", Sensors, vol. 13, 2013, pp. 4640-4658.

* cited by examiner

PIXEL ARCHITECTURE AND AN IMAGE SENSOR

CROSS-REFERENCE TO RELATED APPLICATIONS

The present application is a non-provisional patent application claiming priority to European Patent Application No. 18183652.9, filed Jul. 16, 2018, the contents of which are hereby incorporated by reference.

FIELD OF THE DISCLOSURE

The present disclosure relates to a pixel architecture for detection of incident light and an image sensor comprising an array of pixels. In particular, the present disclosure relates to a pixel architecture and an image sensor, which may be suitably used in high-speed imaging, wherein fast transfer of charges within the pixel architecture is important.

BACKGROUND

In some imaging applications, it is important to acquire information in a very short time period. For instance, this may be important for imaging of high speed events, which may e.g. be used in fluorescence microscopy to detect a timing of induce fluorescence.

In depth or distance sensing applications, there is also a need to acquire information in a very fast manner. Such applications may make use of time-of-flight (TOF), i.e. by determining a point in time when a light pulse reflected by an object is received by an image sensor a distance to the object may be determined. TOF applications may make use of a light pulse that has a very sharp edge. The light pulse or an edge of the light pulse may have a very short duration, such as in the order of nanoseconds or even shorter, which implies that a high resolution of the depth or distance sensing may be obtained.

For TOF applications, a sequence of light pulses may be provided. The acquiring of information may be synchronized with the sequence of light pulses, such that charges generated by the pulses are accumulated so that an integration of information may be performed over a plurality of light pulses in the sequence, so-called lock-in sensing. This may enable an improved signal-to-noise ratio of the TOF sensing.

However, in order to enable acquiring of image information in a fast manner, as desired for TOF applications, an image sensor needs to have pixels that may transfer charges within pixels in a very fast manner in order to acquire information and quickly make the pixel ready for sensing new information.

In US 2011/0187908, there is disclosed a high-speed charge-transfer photodiode encompassing a first conductivity type semiconductor layer serving as a charge-generation region; and a second conductivity type surface-buried region serving as a charge-transfer region of charges generated by the charge-generation region, wherein a specified direction in the surface-buried region provided along a plane parallel to a surface of the semiconductor layer is assigned as a charge-transfer direction of the charges, and at least one of a variation of widths of the surface-buried region measured in an orthogonal direction to the charge-transfer direction and a variation of impurity concentration distributions of the surface-buried region, which are measured along the charge-transfer direction, is determined such that an electric field distribution in the charge-transfer direction is constant.

The structure of US 2011/0187908 however requires an accurate control of the widths of the surface-buried region or the variation of impurity concentration distributions of the surface-buried region in order to achieve the constant electric field distribution, which imposes accurate control requirements on a manufacturing process for producing the structure. Further, a strength of an electric field that can be induced, for driving transport of charges, is limited and hence a speed of collection of charges in a charge-collection region is limited.

SUMMARY

The present disclosure provides a pixel architecture that enables fast transfer of charges within the pixels for facilitating high speed imaging. The pixel architecture enables a dynamically controlled transfer of charges.

According to a first aspect, there is provided a pixel architecture for detection of incident light; the pixel architecture comprising: an absorption layer, which is configured to extend in a first plane, the absorption layer being configured for back-side illumination and being configured to generate charges in response to incident light on an interface of the absorption layer and to transport charges in a direction perpendicular to the first plane; a semiconductor charge-transport layer with a charge-dispatch region and a charge node; the charge-transport layer being arranged to extend in a second plane parallel to the first plane, the charge transport layer being configured to receive generated charges from the absorption layer and to transport the generated charges through the charge-transport layer, wherein one or more doped regions are arranged in the charge-transport layer, wherein the charge-transport layer further comprises a bias region, and wherein the charge-dispatch region, which forms a dedicated region in a lateral direction parallel to the second plane of the charge-transport layer is associated with the bias region; an electric connection connecting to the bias region for providing a selectable bias voltage to the bias region; and at least one transfer gate associated with an area adjoining to the charge-dispatch region in the lateral direction; and wherein the doped regions and the bias region have a different doping in relation to a bulk substrate of the charge-transport layer and wherein the doped regions and the bias region are differently biased for driving transport of the generated charges towards the charge-dispatch region, and for controlling, together with the at least one transfer gate, transfer of charges from the charge-dispatch region in the lateral direction to the charge node.

The pixel architecture of the present disclosure is based on back-side illumination of the pixel. This implies that a wiring layer, e.g. connecting the pixel to read-out structure of an image sensor, may be provided on an opposite side of the pixel compared to the side on which light is incident on the pixel. This implies that light incident on the pixel need not travel through wiring layers and that losses of light in the wiring layer may be avoided. Use of back-side illumination in a high speed imaging application may be advantageous since an amount of light incident on a pixel may be very low due to a short integration time.

This implies that charge transfer in the pixel architecture may be provided in both a vertical direction and a lateral direction. The charge transfer in both vertical and lateral direction provides collection of charges in the charge-dispatch region, wherein charges are transferred through a charge-transport layer from an interface facing a side of the pixel on which light is incident towards an opposite interface facing a side to which the wiring layer of the image sensor is connected in order to be collected in the dedicated region formed by the charge-dispatch region. Then, charges are further transferred in the lateral direction from the charge-dispatch region to charge node(s), which may e.g. include at least one charge storage node, for controlling collection of charges in desired node(s) for read-out of information from the pixel architecture.

Thanks to the one or more doped regions, which may also be biased, being arranged in the charge-transport layer, a potential variation may be provided in the charge-transport layer for driving movement of charges in the charge-transport layer. Thus, the use of doped regions may ensure that a high speed of transfer of charges towards the charge-dispatch region and then from the charge-dispatch region towards a charge node, e.g. a charge storage node, is provided.

The charge-transport layer may be doped with a first charge carrier type, whereas the doped regions may be doped with a second charge carrier type. This may be used for the doped regions to define potentials within the charge-transport layer for driving the charges towards the charge-dispatch region and then towards the charge node(s).

The doped regions may have a different doping in relation to the bulk substrate of the charge-transport layer. The bias region may have a different doping in relation to the bulk substrate of the charge-transport layer. Also, the doped regions and the bias region may have different dopings. However, in some embodiments, a doped region and the bias region may have corresponding dopings.

The absorption layer and the semiconductor charge-transport layer may be integral and may be formed from the same material, e.g. Si. The same layer may thus function both as the absorption layer and the charge-transport layer. Having a relatively thick layer, e.g. 30-50 µm, will enable light to be absorbed within a large thickness of material, which is enables a high absorption rate of incident photons. However, the present disclosure is not limited to any thickness of the absorption layer and/or the charge-transport layer and these layers may be thinner or thicker than the indicated interval.

It should of course be realized that the absorption layer and the semiconductor charge-transport layer may be two different layers, e.g. formed from the same material, with different doping concentrations or doped with different conductivity types, or formed from two different materials.

Thanks to the electric connection connecting to the bias region, the pixel architecture according to the present disclosure may ensure that a potential pocket is induced inside the charge-transport layer in a region adjoining the bias region. This potential pocket forms a charge-dispatch region, to which the generated charges may be transferred to be collected therein. The bias voltage may thus function to drive charges generated by incident light, such that charges will be very quickly collected in the charge-dispatch region. The bias voltage provided to the bias region may be set so as to interplay with biases provided to other nodes of the pixel and with the doped regions in the pixel such that a desired potential pocket is formed at the charge-dispatch region.

Thus, the charge-dispatch region associated with the bias region, according to the present disclosure, may ensure very fast transfer of generated charges towards the charge-dispatch region.

The bias voltage may further be set so as to facilitate, together with the doping of the bias region and the doped regions, driving of charges in a lateral direction from the charge-dispatch region towards a charge node, such as a charge storage node. The bias voltage may thus ensure that charges may be driven towards a transfer gate, such that a high speed of lateral displacement of charges from the charge-dispatch region to a charge node associated with the transfer gate may be obtained. Further, thanks to the bias voltage driving charges towards the transfer gate, a risk of charges being trapped in the charge-dispatch region (and hence affecting subsequent periods of detecting light) may be reduced.

The pixel architecture according to the present disclosure may thus provide a fast transfer of charges both in a vertical and a lateral direction of the pixel. This implies that the pixel architecture is suitable for use in high speed imaging applications. For instance, the pixel architecture may be used for TOF applications, e.g. as a lock-in pixel in a TOF application. However, it should be realized that the pixel architecture may alternatively suitably be used in other type of high speed imaging applications as well.

Since the electric connection is provided to the bias region, to which the charge-dispatch region is associated, the bias voltage may be dynamically selected and may be changed over time, e.g. in relation to when it is desired that charges are to be transferred from the charge-dispatch region to the charge node.

The doped regions may also be biased and the doped regions may be differently biased than the bias region. The doped regions may also be provided with a selectable bias voltage. However, in one embodiment, the doped regions are connected to ground.

The bias voltage of the bias region may be set to drive charges of only one conduction type towards the transfer gate. The bias voltage may be set to drive electrons towards the transfer gate, as electrons may be transferred faster than holes due to the small mass of the electrons.

The charge-dispatch region may form a dedicated region, which is centrally arranged in the pixel in the lateral direction. This implies that charges may be transported towards a central region, which may be beneficial in quickly transferring charges from an entire lateral extension of the absorption layer to the charge-dispatch region.

However, it should be realized that the charge-dispatch region may alternatively be arranged in a different lateral position, e.g. based on other layout considerations, such as for connecting the pixel to control wires.

The charge node may be used for read-out of information from the pixel architecture. The charge node may thus be a memory node, which may store the charge transferred thereto for some time, until a control signal is received for reading out a value corresponding to the amount of charge stored in the memory node.

Alternatively, the charge node may be used for dumping charges in order to prepare the pixel for detecting new information. Thus, the charge node may be a drain node.

As a further alternative, the charge node may be an additional collection node (in addition to the charge-dispatch region), which may be used for further transfer of charges within the pixel.

It should also be realized that the pixel architecture may comprise a plurality of charge nodes of one or more types associated with the charge-dispatch region.

The doped regions may be formed as implants in the charge-transport layer. Thus, in one embodiment, the doped regions may form implant regions in relation to a bulk substrate of the charge-transport layer. However, the doped regions could be formed in any manner to create a region having a different doping than the charge-transport layer.

According to an embodiment, the bias region may be arranged at a surface of the charge-transport layer facing away from the absorption layer. Further, the charge-dispatch region may be associated with the bias region and the bias region may be arranged between the charge-dispatch region and the surface of the charge-transport layer. This implies that the charge-dispatch region may be formed close to the surface of the charge-transport layer, but below the bias region in relation to the surface. Hence, charges may be collected in the charge-dispatch region close to a surface where a signal from the pixel is to be read out, such that the charges may then be moved laterally from the charge-dispatch region to a charge storage node for read-out of the signal.

According to an embodiment, the bias region is formed by a doped implant in the charge-transport layer, wherein the bias region is doped with a same charge carrier type as the doped regions and a doping concentration of the bias region is higher than a doping concentration of the doped regions.

Thanks to the bias region being formed as a doped implant in the charge-transport layer, the bias region may define a potential within the charge-transport layer for facilitating collection of charges, as further set by the bias voltage applied to the bias region.

The bias region may be doped with the same charge carrier type as the doped regions and with a higher doping concentration, wherein the bias voltage applied to the bias region together with voltages applied to the doped regions as well as biases on transfer gate(s) defines a potential pocket in the charge-transport layer to form the charge-dispatch region such that charges are driven towards the charge-dispatch region for collection therein.

According to an embodiment, the bulk substrate of the charge-transport layer may form an n-type region, the doped regions may form p-type regions, the charge-dispatch region may form an n-type region, and the bias region may form a p+-type region. Further, a charge storage node may form a n+-type region within an implant region.

However, it should be realized that alternatively the bulk substrate of the charge-transport layer may form a p-type region, the doped regions may form n-type regions, the charge-dispatch region may form a p-type region and the bias region may form a n+-type region.

According to an embodiment, a bulk substrate of the absorption layer forms a depleted region.

This implies that the pixel may provide a thick depleted substrate that provides a large column for detection of light and at the same time provides an electrical field for driving charges at high speed towards the charge-dispatch region.

According to an embodiment, a plurality of doped regions is arranged in the charge-transport layer on opposite sides in relation to a lateral extension of the charge-dispatch region, wherein a distance between doped regions on opposite sides of charge-dispatch region is smaller closer to a surface of the charge-transport layer facing away from the absorption layer, such that a doped region forms a terrace-type structure in the charge-transport layer.

This implies that closer to the surface of the charge-transport layer at which the charge-dispatch region is arranged, a lateral distance between the doped region and the charge-dispatch region is smaller. This implies that charges are driven by the doped region further towards the lateral position of the charge-dispatch region at vertical positions closer to the charge-dispatch region. This causes a focus of charges towards the desired lateral position of the dedicated region and drives charges both in a lateral and vertical direction of the charge-transport layer towards the charge-dispatch region. Also, doped regions close to the surface of the charge-transport layer may contribute to driving of charges in a lateral direction from the charge-dispatch region towards the charge node(s).

According to an embodiment, the pixel architecture further comprises a plurality of bias regions in the dedicated region and a plurality of electric connections for individually connecting to each of the bias regions for providing a selectable bias voltage to each of the bias regions, wherein the at least one transfer gate is associated with an area adjoining a bias region at an edge of the dedicated region.

This implies that a plurality of sub-nodes (formed by the plurality of bias regions) may be formed in the dedicated region. Thanks to the sub-nodes being individually connected to electric connections, an improved control may be provided of transfer of charges between parts of the charge-dispatch region associated with different sub-nodes and, as controlled by the transfer gate, to the charge node.

According to an embodiment, each of the plurality of bias regions is formed by an individually doped implant in the charge-transport layer.

This implies that the doping of each implant may be individually set. This may be useful in order to provide a desired transfer of charges between parts of the charge-dispatch region associated with different sub-nodes and to the charge node.

According to an embodiment, areas between adjacent bias regions are connected to an external structure for shaping an electric field in the dedicated region.

The external structure may provide a bias voltage to the areas between adjacent bias regions. Further, different bias voltages may be provided to different areas between different pairs of adjacent bias regions. This implies that the electric field in the dedicated region may be shaped and dynamically controlled through the external structure for further controlling the transfer of charges between parts of the charge-dispatch region associated with different sub-nodes and to the charge node.

According to an embodiment, the pixel architecture further comprises a plurality of transfer gates, each associated with different areas adjoining to the bias region in the lateral direction and associated with different charge nodes for controlling transfer of charges from the charge-dispatch region in the lateral direction to the corresponding charge node.

This implies that the charges in the charge-dispatch region may be selectively transferred to different charge nodes, as controlled by the plurality of transfer gates. Thus, the different charge nodes may provide different functionalities to the pixel.

For instance, a first charge node may be used as a drain node, when it is desired to reset the pixel for reading new information, whereas a second charge node may be used as a memory node for storing charge integrated during an integration period.

In another embodiment, two charge nodes are used as separate memory nodes. This may be used for storing charges integrated during different integration periods in different charge nodes, which may be useful e.g. in a TOF application, wherein charges accumulated during a first time period in relation to a light pulse is stored in a first memory node and charges accumulated during a second time period in relation to the light pulse is stored in a second memory node.

According to an embodiment, the absorption layer is formed by a different material than the charge-transport layer.

The absorption layer may thus be formed by a material which has a high absorption of a wavelength of light to be detected, which may improve sensitivity of the pixel.

For instance, Ge may be used for the absorption layer. This may provide a higher absorption coefficient than Si for near-infrared wavelengths.

According to an embodiment, the pixel architecture further comprises an electric lens for forming an electric field in the charge-transport layer for driving transport of the generated charges in a lateral direction in the charge-transport layer towards the charge-dispatch region.

This may further improve charge transfer in the charge-transport layer towards the charge-dispatch region and may hence improve speed of transfer of charges.

According to an embodiment, the pixel architecture further comprises an integrated optical micro-lens arranged in front of the absorption layer and configured to receive incident light and focus light towards a center of the absorption layer.

Thanks to the optical micro-lens focusing light towards a center of the absorption layer, absorption of light is increased in the center of the absorption layer, which also implies that charges are mainly generated in the absorption layer at the center. This improves a speed of charge transfer towards the dedicated region, when it is arranged at a central position in the lateral direction.

The light being focused towards the center of the absorption layer should be construed that the light is deviated in a lateral direction of the first plane so that intensity of light is increased in a lateral direction towards a central lateral position.

The optical micro-lens being arranged in front of the absorption layer should be construed as the optical micro-lens being arranged in front of the absorption layer with respect to a direction from which incident light is received. This implies that light incident towards the pixel architecture reaches the optical micro-lens before reaching the absorption layer. The optical micro-lens may be arranged on the interface of the absorption layer that is arranged to receive incident light.

According to an embodiment, the pixel architecture further comprises an integrated Fabry-Pérot filter, which is configured to selectively pass a wavelength range of incident light to reach the absorption layer.

This implies that a wavelength range of light that reaches the absorption layer may be controlled by the Fabry-Pérot filter. This may e.g. be used to filter out undesired light when a light measurement is to be performed with the pixel architecture. According to one example, in a fluorescence application, only the fluorescence wavelength may be passed by the Fabry-Pérot filter such that e.g. excitation light may be filtered out. According to another example, in a TOF application, wavelengths other than an emitted wavelength for the pulsed light may be filtered out.

The use of a Fabry-Pérot filter integrated with the pixel may also imply that different pixels in an array of pixels may be associated with different filters, such that different wavelengths may be detected in different parts of the array. This may be useful for imaging with spectral resolution.

According to a second aspect, there is provided an image sensor comprising: an array of pixels, each having a pixel architecture according to the first aspect; and a control unit, which is configured to provide control signals for controlling transfer of charges from the charge-dispatch region to the charge node of each pixel.

Effects and features of this second aspect are largely analogous to those described above in connection with the first aspect. Embodiments mentioned in relation to the first aspect are largely compatible with the second aspect.

The image sensor using pixel architecture according to the present disclosure in the array of pixels may thus provide a fast transfer of charges both in a vertical and a lateral direction of the pixels. This implies that the image sensor is suitable for use in high speed imaging applications.

The control unit may be used for controlling timing of charges form the charge-dispatch region to the charge node of each pixel in order to control imaging using the array of pixels.

According to an embodiment, each pixel is configured to receive incident light from a pulsed light reflected by a target sample for generating charges, wherein each pixel comprises a first and a second transfer gate associated with a first and a second charge node, respectively, and wherein the control unit is configured to synchronize transfer of charges to the first and the second transfer gate, respectively, with the pulsed light such that a ratio of charges in the first and second charge nodes forms a measure of a distance to the target sample.

This implies that the image sensor may be used for a TOF application. The ratio of charges in the first and second charge nodes in relation to a time of emission of a light pulse may be used for determining a distance between the image sensor and the target sample.

It should also be realized that in an embodiment, one of the two charge nodes may be formed simply as a drain node to which charges may be dumped. Thus, the measure of the distance to the target may be determined based on making an assumption of a total amount of charges to be generated by a received reflected pulse. Thus, the amount of charges in one storage node may be used to determine a measure of the distance, as the measure obtained from a single storage node may reflect a ratio of charges in the storage node and charges being dumped in a drain node (which may be based on the assumption of total amount of charges to be generated by the received reflected pulse).

Further, it should be realized that a measure of the distance to the target sample may be determined by any type of calculation of amount of charges in the first and second charge nodes (as detected or based on assumption of total amount of charges to be generated) and that it is not necessary to actually calculate a ratio of the charges in the first and the second charge nodes.

Also, it should be realized that more than two charge nodes may be used for storing charges generated during different periods in time in relation to the pulsed light.

According to an embodiment, the control unit is configured to synchronize transfer of charges to the first and the second transfer gates with a sequence of light pulses for lock-in sensing.

Thanks to the control unit synchronizing transfer of charges with a sequence of light pulses, accumulation of charges for a plurality of light pulses in the sequence may be performed in the pixel so as to provide lock-in sensing with an improved signal-to-noise ratio compared to a measurement based on a single light pulse.

According to an embodiment, the control unit is configured to control reset of the pixel and reading of a first voltage level from a floating diffusion node followed by followed by transfer of charges from the charge node to the floating diffusion node and reading of a second voltage level from the floating diffusion node for correlated double sampling.

Thanks to the bias voltage driving charges towards a transfer gate, a risk of charges being trapped in the charge-dispatch region (and hence affecting subsequent periods of detecting light) may be reduced. Thus, the charge-dispatch region may be fully depleted when the pixel is reset. This implies that any noise in the read-out of information from the pixel may originate from a conversion of a charge in the charge node to a voltage signal via the floating diffusion node. This noise may be compensated for through correlated double sampling, by reading out a noise level from the charge node. Hence, the image sensor may be used for ensuring a very low noise level in read out signals, which enables acquiring images with a very high signal-to-noise ratio.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Detection of time-of-flight (TOF) of light may be used for determining a distance to a target. A TOF sensor system may thus be configured to emit a pulsed light in the form of one or more light pulses and detect reflections of the pulsed light. A time of arrival of the pulsed light reflected by the target may thus be related to the time of emission of the pulsed light to determine the distance to the target. The TOF sensor system may in this way, for instance, be used to provide a three-dimensional image of the target.

TOF applications may typically use very short exposure times (in order of nanoseconds or even picoseconds) for detecting the pulsed light reflected by the target in order to enable accurate determination of the distance to the target. This implies that charges generated in a pixel of an image sensor used to detect incident light needs to be transferred very quickly within the pixel in order to enable accurate TOF sensing.

According to the present disclosure, an image sensor is provided, wherein charges are transferred quickly, which means that the image sensor is suitable for use in a TOF application. However, it should be realized that, although the following detailed description is mainly provided in relation to a TOF application, the fast transfer of charges in the pixels of the image sensor may alternatively be used in other types of applications, such as imaging of very fast events, e.g. for use in fluorescence microscopy. Also, even though the image sensor is suitable for high-speed imaging applications, it is not necessary to use the image sensor only in such type of applications. Rather, the image sensor may be used in other applications, wherein speed of acquiring image information is not of high importance.

Figure 1:
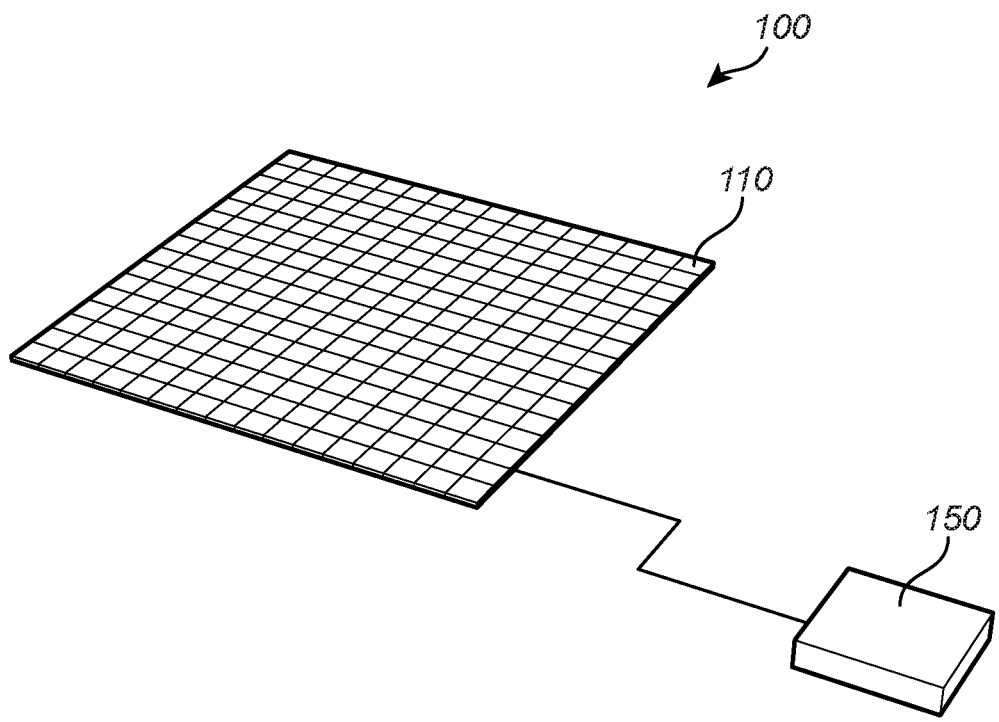
FIG. 1 is a schematic view of an image sensor, according to an example embodiment.

FIG. 1 illustrates an image sensor 100. The image sensor 100 comprises an array of pixels 110, wherein the pixels 110 are configured to detect incident light. The light detected by the pixel 110 may form information of an image element, such that a two-dimensional array of pixels 110 may be used to acquire a two-dimensional image. When the image sensor 100 is used in a TOF application, each image element may provide information of a distance to the target, such that a three-dimensional representation of the target may be acquired by the image sensor 100.

Each pixel 110 may be configured to generate a response, such as an electric charge, in proportion to light incident on the pixel 110. Thus, the pixel 110 may generate a measurement of intensity of light being received by the pixel 110.

The array of pixels 110 may be controlled by a control unit 150, which may be configured to provide control signals to the array of pixels 110. The control signals may be used for activating and terminating integration of incident light in the pixels 110 so as to set an exposure time of each pixel 110. The control signals may further be used for activating read-out of information from the pixels 110 to read out image information from the array of pixels 110.

The read out information may be transferred to one or more analog-to-digital converters for converting analog readings of amount of light received by the pixels 110 to a digital image representation. The digital image representation may further be provided to an image processing unit, which may or may not be part of the image sensor 100 for further processing of the image.

The image sensor 100 may further comprise wiring layer(s). The wiring layer(s) may comprise a plurality of wires forming connections to the pixels 110 in the array. The wiring layer(s) may be arranged, at least partly, in a plane parallel to the array of pixels 110. The wires may be used for transferring control signals to the pixels 110 and for reading out information of detected light from the pixels 110.

The control unit 150 may be configured to provide control signals for performing TOF sensing. The control unit 150 may thus be synchronized with a controller for controlling emission of pulsed light. Alternatively, the control unit 150 may be connected to a light source, such that the control unit 150 also controls output of pulsed light from the light source.

The control unit 150 may be implemented in hardware or as any combination of software and hardware. For instance, the control unit 150 may comprise a central processing unit (CPU) comprising software for providing functionality of the control unit 150 in a general-purpose processor. Alternatively, the control unit 150 may be implemented as firmware arranged in an embedded system of the image sensor 100. As a further alternative, the control unit 150 may be implemented as a special-purpose circuitry for providing specific logical operations. Thus, the control unit 150 may for example be provided in the form of an application-specific integrated circuit (ASIC), an application-specific instruction-set processor (ASIP) or a field-programmable gate array (FPGA).

Figure 2:
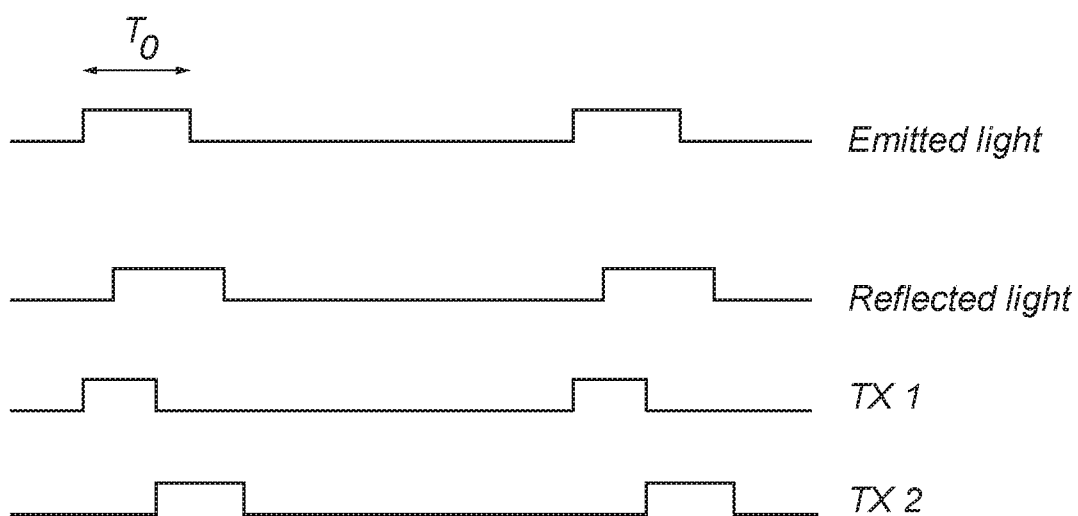
FIG. 2 is a schematic view of control signals for performing time-of-flight sensing by the image sensor, according to an example embodiment.

As illustrated in FIG. 2, pulsed light is emitted by the light source. The pulsed light is emitted during a time period $T_0$. The pulsed light will be reflected by a target and the reflected light is received and detected by the image sensor 100.

The control unit 150 may control, via a control signal TX1, each pixel 110 to integrate light during a first exposure time. The first exposure time Ti has a well-defined relation to the emission of the pulsed light. The control unit 150 may further control, via a control signal TX2, each pixel 110 to integrate light during a second exposure time following the first exposure time.

As illustrated in FIG. 2, the first exposure time and the second exposure time may be set such that part of the reflected light pulse is received by the pixel 110 during the first exposure time and part of the reflected light pulse is received by the pixel 110 during the second exposure time. A relation between the received light during the first exposure time and the received light during the second exposure time may form a measure of the distance to the target.

Thus, the control unit 150 may control the pixels 110 to store two measures of detected light, corresponding to the first exposure time and the second exposure time. By reading out the two measures, the distance to the target may be determined. The distance D to the target may be calculated as:

$$D=c*T_0/2*(S_1/(S_1+S_2)),$$

where c is speed of light, $S_1$ is an amount of light detected during the first exposure time and $S_2$ is an amount of light detected during the second exposure time. This calculation of the distance is dependent on the pulsed light having a constant intensity during the time period $T_0$.

It should be realized that the distance may be determined based only on detecting a single measurement by each pixel 110, if a reflective response by the target is known or may be approximated. In such case, the amount of light detected during an exposure time may be compared to a total amount of light available in the reflected light pulse.

As will be appreciated by a person skilled in the art, there are numerous other ways of performing a TOF measurement. For instance, one may use a pixel 110 having more than two storage nodes (and associated transfer gates), in which measurements of incident light in the form of generated charges may be provided. Alternatively or additionally, a plurality of frames may be acquired, wherein different timing settings may be used for different frames.

As further illustrated in FIG. 2, a sequence of light pulses may be emitted. The first and second exposure times may have an identical relation to each of the light pulses in the sequence. This implies that the amount of light detected in a series of first exposure times may be accumulated within each pixel 110 and the amount of light detected in a series of second exposures times may be accumulated within each pixel 110. Thus, each pixel 110 may perform lock-in sensing so as to improve a signal-to-noise ratio for determining the distance to the target and hence improve accuracy of determining the distance.

In TOF sensing, it is important that charges generated by incident light on a pixel 110 during a time period may be accurately detected during that time period. Thus, each pixel 110 may need to be able to transfer charges within the pixel 110 very quickly. As will be further explained below, a pixel architecture of the pixels 110 is designed so as to allow fast transfer of charges within the pixels 110.

The control unit 150 may further be configured to control the pixels 110 so as to enable correlated double sampling, CDS. This may be combined with the TOF sensing described above. However, CDS sensing may alternatively be used with any image acquisition performed by the image sensor 100.

Thus, the control unit 150 may be configured to ensure read out of a noise level signal as well as a measurement signal, such that the noise level signal may be subtracted from the measurement signal to remove read-out noise. This implies that a very high signal-to-noise ratio may be provided.

In particular, as will be explained further below, the pixel 110 may ensure that charges are not trapped in a charge-dispatch region in which generated charges are first collected or in regions between the charge-dispatch region and storage nodes from which a measurement signal is read, which implies that the pixel 110 will not add noise due to trapped charges. Hence, a noise level in read out signals from the pixels 110 may be created in reading out of a signal from the pixel when charges in the pixel 110 are converted to a voltage signal. This noise may be compensated for by the control unit 150 providing a reset signal in order to remove charges in the pixel 110 and then reading out a noise level signal which may be used to compensate for noise created in read-out.

Figure 3:
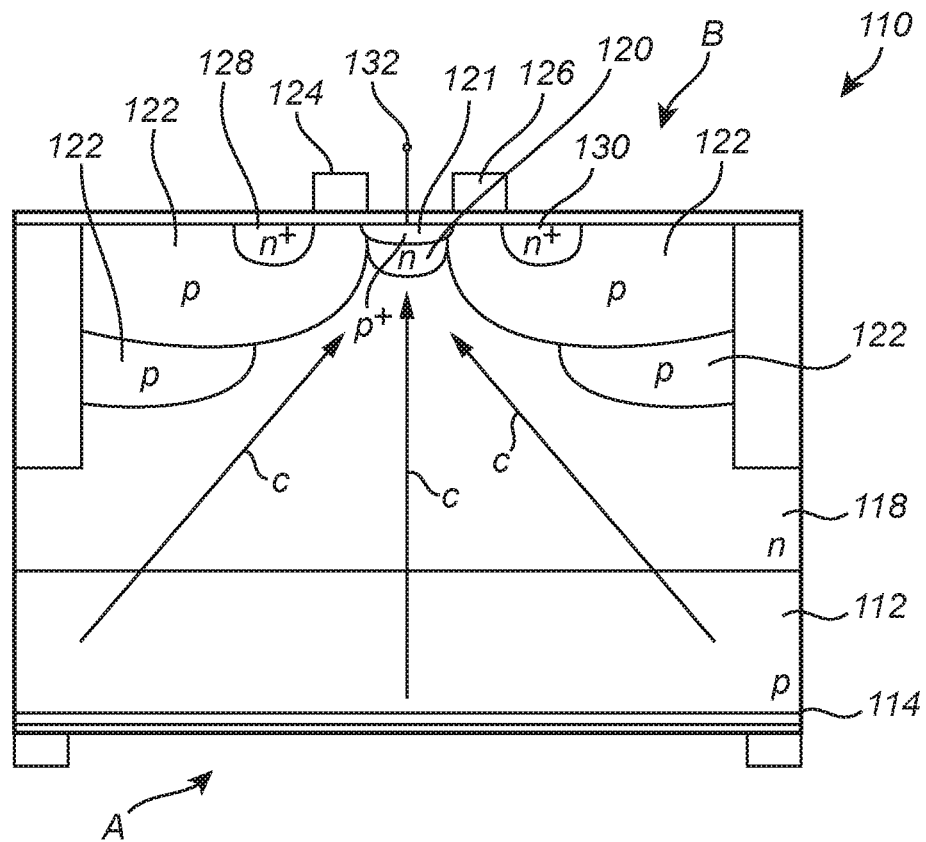
FIG. 3 is a schematic cross-sectional view of a pixel architecture for pixels of the image sensor, according to an example embodiment.

Referring now to FIG. 3, a pixel architecture according to a first embodiment for pixels 110 in the array will be described.

The pixel 110 may be configured for back-side illumination. This implies that light may be incident on the pixel 110 at a side A which is opposite from a side B of the pixel 110, wherein connections to wiring layer(s) and circuitry of the image sensor 100 is provided.

This implies that light incident on the pixel 110 will not need to pass through the wiring layer(s), which implies that no light losses occur in the wiring layer(s).

An image sensor 100 for back-side illumination may for instance be produced by forming circuitry connected to the pixels 110 on a substrate followed by grinding of the substrate in order to expose pixels 110 from the back-side.

The pixel 110 may comprise an absorption layer 112. The absorption layer 112 may be configured to receive light incident on the pixel 110 through the back-side A. The absorption layer 112 may define a surface of the pixel 110, but be covered by a bias supply layer 114. The bias supply layer 114 may provide a plane of constant bias across the back-side of the image sensor 100, which may ensure that the absorption layer 112 is depleted to facilitate generation and transfer of charges in the absorption layer 112.

The absorption layer 112 may be configured to absorb incident light so as to form photon-generated charges in response to absorption of light. The absorption layer 112 may thus be formed from a material which absorbs light of a desired wavelength of light. For instance, the absorption layer 112 may be formed from Si.

In order to increase sensitivity of the pixel 110, the absorption layer 112 may be thick, so as to ensure that a high percentage of incident light will be absorbed in the absorption layer 112. For instance, the absorption layer 112 may have a thickness of 30-50 μm. However, it should be realized that the thickness of the absorption layer may be thinner or thicker than the indicated interval.

The charges generated due to absorption of light are transferred through the pixel 110 in order to be collected and enable reading out a signal representative of an amount of incident light on the pixel 110.

The pixel 110 may therefore comprise a semiconductor charge-transport layer 118. The charge-transport layer 118 may be configured to transfer charges towards a charge-dispatch region 120.

A bias region 121 may be formed in the charge-transport layer 118 at a surface of the charge-transport layer 118 at the side B of the pixel 110, opposite to the side A where light is incident.

The bias region 121 may further be provided with a bias voltage, which together with voltages applied to various nodes/regions in the pixel, induces a potential pocket to be formed inside the charge-transport layer 118 in a region adjoining the bias region 121. This potential pocket forms a charge-dispatch region 120, to which the charges generated by absorption of light may be transferred to be collected therein. The bias voltage may thus function to drive charges generated by incident light, such that charges will be very quickly collected in the charge-dispatch region 120.

The charge-transport layer 118 may be formed by a semiconductor material, which may be depleted. This may imply that photon-generated charges which enter the charge-transport layer 118 from the absorption layer 112 may be driven towards the charge-dispatch region 120 by a potential pocket as defined by the bias region 121 and other nodes, such as doped regions and transfer gates, as will be described later.

The charge-transport layer 118 may be integral with the absorption layer 112 and may be formed from the same material, wherein the absorption layer 112 and the charge-transport layer 118 is depleted. According to an embodiment, the absorption layer 112 and the charge-transport layer 118 may be formed in Si, wherein the absorption layer forms a p-type region and the charge-transport layer 118 forms an n-type region.

The pixel 110 may further comprise one or more doped regions 122 in the charge-transport layer 118. The doped regions 122 may be doped to define a potential for driving charges in the charge-transport layer 118 in a lateral direction towards the charge-dispatch region 120. The doped regions 122 may be formed as implants in the charge-transport layer 118 and the terms doped regions and implant regions are used interchangeably hereinafter.

As indicated in FIG. 3, the implant regions 122 may form a terrace-type structure such that, at different depths within the charge-transport layer 118, the implant regions 122 have different lateral extensions so as to form a structure similar to terraces. Further, terrace-type structures may be formed on opposite sides in relation to the charge-dispatch region 120 or to completely surround the charge-dispatch region 120. There may be a distance between opposing terrace-type structures, which distance may be smaller towards a surface of the charge-transport layer 118, at which surface the charge-dispatch region 120 is arranged. This implies that the implant regions 122 may drive charges closer to the charge-dispatch region 120 as the charges approach the surface of the charge-transport layer, so that the implant regions 122 also forms a drive of the charges in a vertical direction through the charge-transport layer 118, as illustrated by arrows C in FIG. 3.

The implant regions 122 may be doped with a different charge carrier type than the charge-transport layer 118, e.g. to form a p-type region within the charge-transport layer 118.

The bias region 121 may form a doped implant at the surface of the charge-transport layer 118. The bias region 121 may define a potential within the charge-transport layer 121 for facilitating collection of charges. The bias region 121 may be a highly doped implant so as to form a p+-region. This implies that a potential pocket may be formed in the n-type charge-transport layer 118 adjoining the bias region 121, such that a charge-dispatch region 120 is defined wherein charges may be collected.

The structure of the charge-transport layer 118 with the implant regions 122 may drive charges towards the charge-dispatch region 120 such that charges generated by absorption of incident light in the absorption layer 112 may quickly be transferred through the charge-transport layer 118 to the charge-dispatch region 120 and be collected therein.

Hence, during an exposure period, the pixel 110 will generate charges corresponding to an amount of incident light and collect the charges in the charge-dispatch region 120.

The charge-dispatch region 120 may be centrally arranged in the pixel 110. However, it should be realized that the charge-dispatch region 120 may be arranged at a different lateral position and that a structure of the implant regions 122 may be adapted for driving charges to the lateral position in which the charge-dispatch region 120 is arranged.

The pixel 110 may further comprise one or more transfer gates, illustrated in FIG. 3 as a first transfer gate 124 and a second transfer gate 126. The transfer gates 124, 126 may be arranged at an edge of the bias region 121 and the charge-dispatch region 120 and be associated with respective areas adjoining to the charge-dispatch region 120. Upon providing of a control signal to a transfer gate 124, 126, the charges collected in the charge-dispatch region 120 may be transferred through the area associated with the transfer gate 124, 126 to a charge node 128, 130 associated with the transfer gate 124, 126.

The pixel 110 further comprises an electric connection 132 to the bias region 121. This implies that the electric connection 132 may be connected to a voltage for providing a bias voltage to the bias region 121.

The bias voltage may be controlled, e.g. via the control unit 150, such that the bias voltage provided to the bias region 121 may be dynamically changed.

The bias voltage may be set such that charges in the charge-dispatch region 120 are driven laterally in the charge-dispatch region 120 towards a transfer gate 124, 126. This implies that the bias voltage provided through the electric connection 132 may increase speed of transfer of charges from the charge-dispatch region 120 to the charge node 128, 130. Thus, charges may be quickly transferred to a charge node 128, 130 such that the pixel 110 is suitable for high-speed imaging.

The bias region 121 may be provided with a positive bias voltage for driving electron charge carriers towards the transfer gate 124, 126. The positive bias voltage may thus cause an improved drive of charges from the charge-dispatch region 120 to the charge node 128, 130.

The pixel 110 may comprise a plurality of charge nodes 128, 130. In one embodiment as illustrated in FIG. 3, the pixel 110 may comprise two charge nodes 128, 130 functioning as storage nodes, to which charges are transferred from the charge-dispatch region 120 for providing a signal representative of amount of detected light. The pixel 110 may further or instead of one of the storage nodes, comprise a charge node functioning as a drain node, to which charges are dumped, e.g. in order to reset the pixel 110 before an exposure period.

The driving of charges to the charge nodes 128, 130 may be controlled by three control signals, a first signal provided to the first transfer gate 124, a second control signal provided to the second transfer gate 126 and a third control signal provided through the electric connection 132 to the bias region 121. The control signals may be set as to selectively drive charges to one of the charge storage nodes 128, 130 or to the drain charge node.

One or two of the control signals may be set to a generally constant DC value, wherein a level of the remaining control signal(s) may control the transfer of charges from the charge-dispatch region 120. For instance, the control signals may be set such that charges are by default transferred to the drain charge node, whereas a level of e.g. the first control signal provided to the transfer gate 124 may be changed in order to cause a transfer of charges to the charge storage node 128 instead. However, all the three control signals may be changed depending on desired transfer of charges so as to provide an accurate control of transfer of charges within the pixel 110.

The pixel 110 may comprise a plurality of memory nodes, e.g. two memory nodes. This may for instance be useful in a TOF application, wherein charges accumulated during a first exposure time may be transferred to a first memory node and charges accumulated during a second exposure time may be transferred to a second memory node.

Thanks to the use of the electric connection 132 in addition to the transfer gates 124, 126, the driving of charges from the charge-dispatch region 120 to the respective charge nodes 128, 130 may be improved. This implies that transfer of charges in the lateral direction may be increased and that a risk of charges being trapped in the charge-dispatch region 120 or incompletely transferred from the charge-dispatch region 120 may be reduced. This also implies that the pixel 110 may provide a low noise level in signals read out from the pixel 110.

The bias voltage provided by the electric connection 132 to the charge-dispatch region 120 may drive electrons towards the transfer gate 124, 126. Thanks to the electric connection 132, the bias voltage may be dynamically set and may e.g. be controlled by the control unit 150, such that the bias voltage may be switched, e.g. in dependence of a desire to drive charges towards different charge nodes 128, 130.

Figure 4:
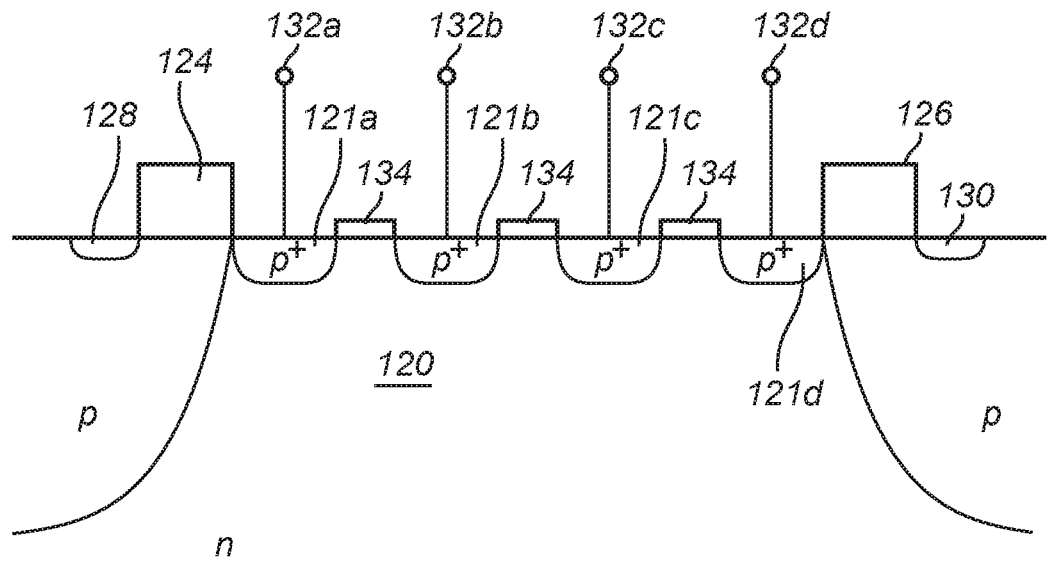
FIG. 4 is a schematic cross-sectional view of a portion of the pixel architecture for pixels of the image sensor, according to an example embodiment.

Referring now to FIG. 4, a pixel architecture according to a second embodiment for pixels 110 in the array will be described.

In the second embodiment, a plurality of bias regions 121a, 121b, 121c, 121d are provided. Each bias region 121a-d may be formed at the surface of the charge-transport layer 118. Each bias region 121a-d may define a potential within the charge-transport layer for forming the charge-dispatch region 120 and facilitating collection of charges. The bias regions 121a-d may be formed as separate highly doped implants so as to form a p+-region. Thus, a doping concentration of the implants may be different for each of the bias regions 121a-d or may be similar for all bias regions 121a-d.

The bias regions 121a-d may together define a charge-dispatch region 120 and different bias regions 121a-d may then be associated with different parts of the charge-dispatch region 120. The bias regions 121a-d may thus control potentials within the charge-dispatch region 120 and may drive and control transfer of charges within the charge-dispatch region 120.

Each of the bias regions 121a-d may be associated with a separate electric connection 132a-d, such that a bias voltage may be independently set for each of the bias regions 121a-d.

Further, areas between adjacent bias regions 121a-d may be connected to an external structure 134. The external structure 134 may be connected to a bias voltage for further controlling the electric field in the charge-dispatch region 120.

The electric connections 132a-d to the bias regions 121a-d may be used for increasing or decreasing the voltage applied to subsequent bias regions 121a-d so that a potential is generated for transferring the charges in the charge-dispatch region 120 to the transfer gates 124, 126.

Referring now to FIGS. 5-8, additional, optional features of the pixels 110 will be described.

Figure 5:
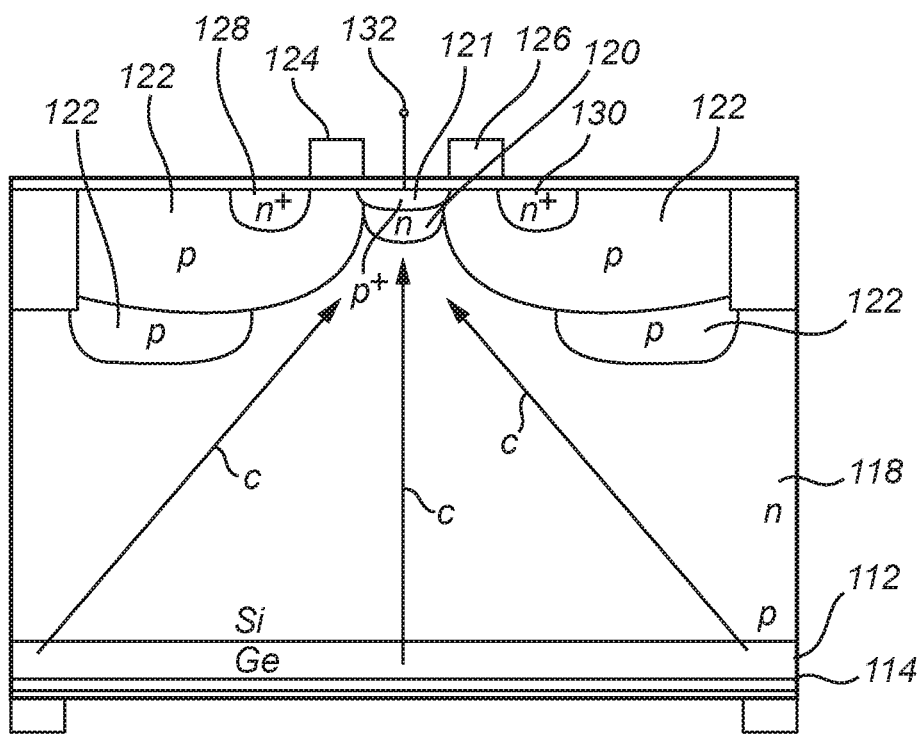
FIG. 5 is a schematic cross-sectional view of the pixel architecture for pixels of the image sensor, according to an example embodiment.

In FIG. 5, a pixel 110 is shown, wherein an absorption layer 112 is provided in a different material than the charge-transport layer 118. The absorption layer 112 may thus be formed from a material which may be specifically suited for absorption of a wavelength of light desired to be detected. For instance, the absorption layer 112 may be formed from Ge, which may be suitable in detection of wavelengths wherein solar background radiation is low, such as for detection of wavelengths of approximately 940 nm.

Figure 6:
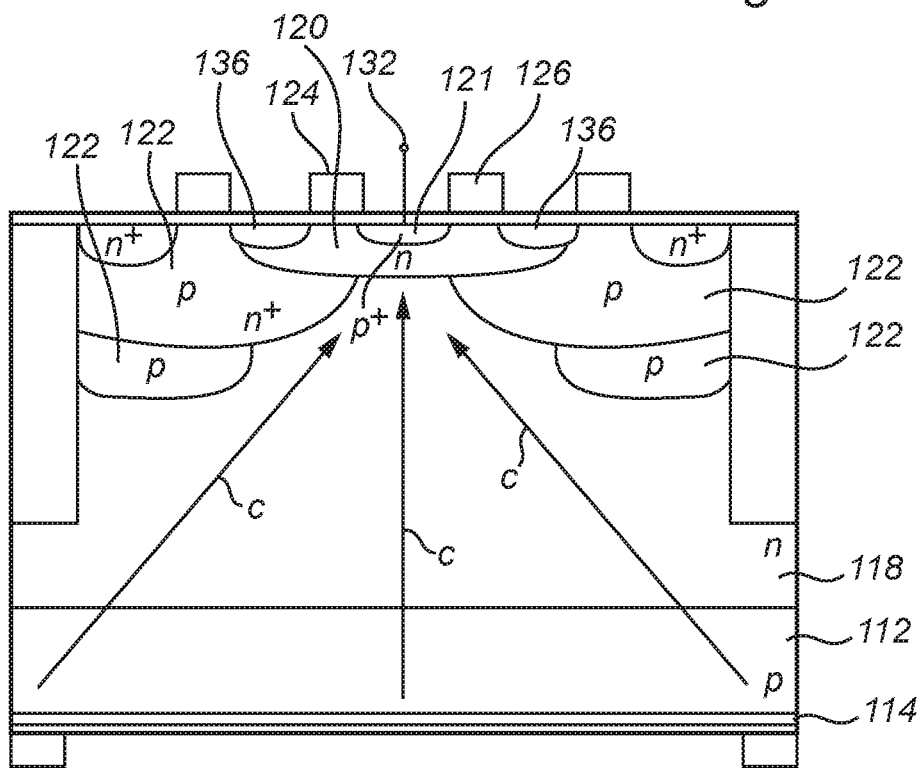
FIG. 6 is a schematic cross-sectional view of the pixel architecture for pixels of the image sensor, according to an example embodiment.

In FIG. 6, a pixel 110 is shown, wherein the pixel 110 is provided with a pinned storage node 136. Charges from the charge-dispatch region 120 may thus be transferred to the pinned storage node 136 or to a selected one of a plurality of pinned storage nodes 136. This allows for very low charge leakage and facilitates multiple accumulation of detected charges.

Alternatively, MOS capacitors may be used as storage nodes. These can for instance be MOS capacitors with buried channel.

Figure 7:
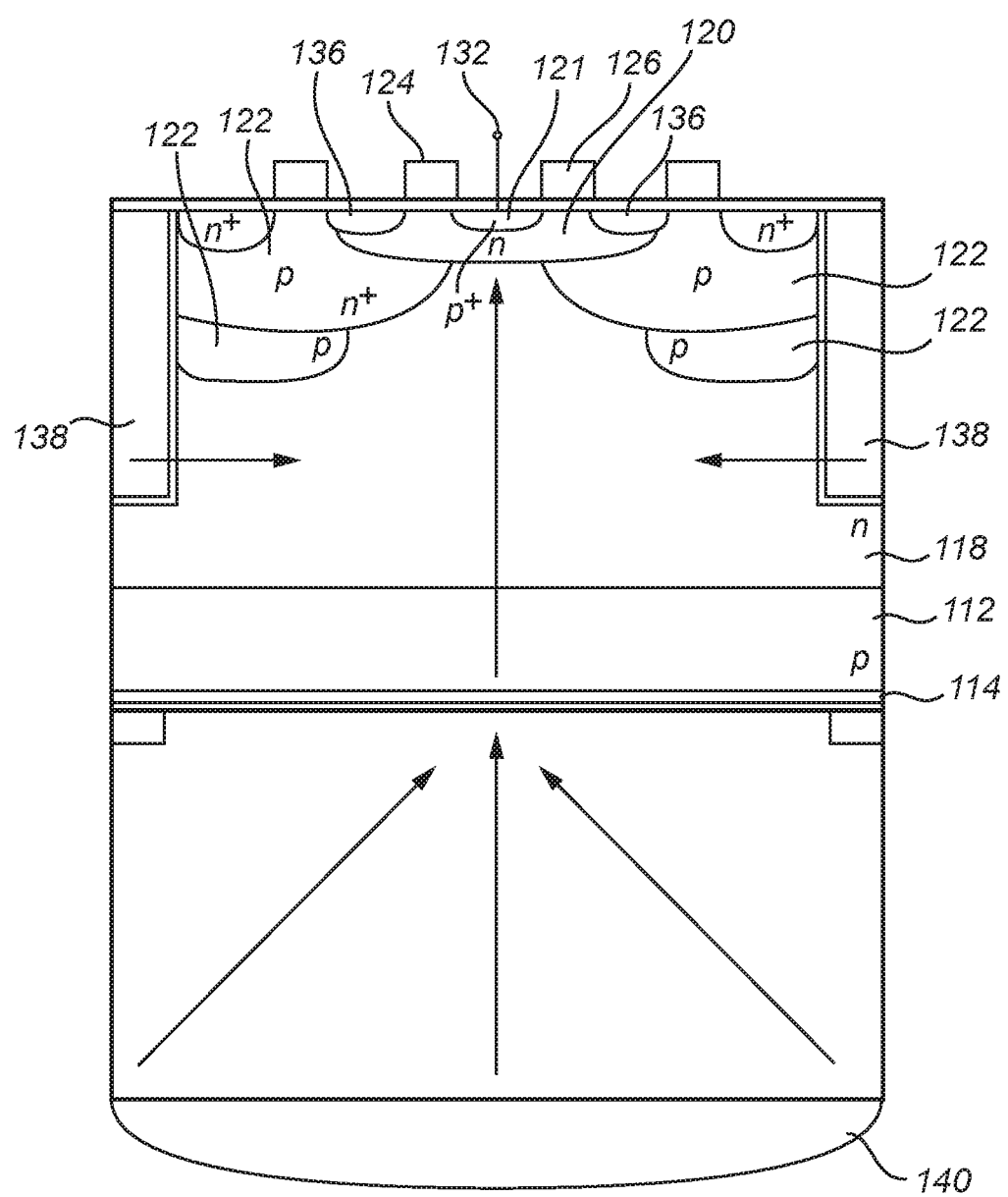
FIG. 7 is a schematic cross-sectional view of the pixel architecture for pixels of the image sensor, according to an example embodiment.

In FIG. 7, a pixel 110 is shown, wherein the pixel 110 is further provided with electric connections 138 surrounding the pixel 110 and extending at least partially along a thickness of the charge-transport layer 118. The electric connections 138 may be provided with a bias voltage to form an electric lens providing an electric field in the charge-transport layer 118 for driving charges in a lateral direction in the pixel 110 towards the charge-dispatch region 120.

This may further improve transport of charges towards the charge-dispatch region 120 in the pixel 110.

As further illustrated in FIG. 7, the pixel 110 may further be provided with an optical micro-lens 140, which may be attached to the pixel 110 in front of the absorption layer 112, such that light incident on the pixel 110 will pass through the micro-lens 140 before reaching the absorption layer 112.

The micro-lens 140 may be configured to divert light towards a center of the pixel 110 in a lateral direction. This implies that an intensity of incident light will be stronger in a central part of the pixel 110 so as to generate more charges in the central part of the pixel 110 such that the charges will be generated closer to the charge-dispatch region 120.

The micro-lens 140 may have a shape so as to focus light towards a center of the pixel 110 and may thus for instance be formed as a plano-convex lens as indicated in FIG. 7. However, according to an alternative, the micro-lens 140 is a Fresnel lens.

Figure 8:
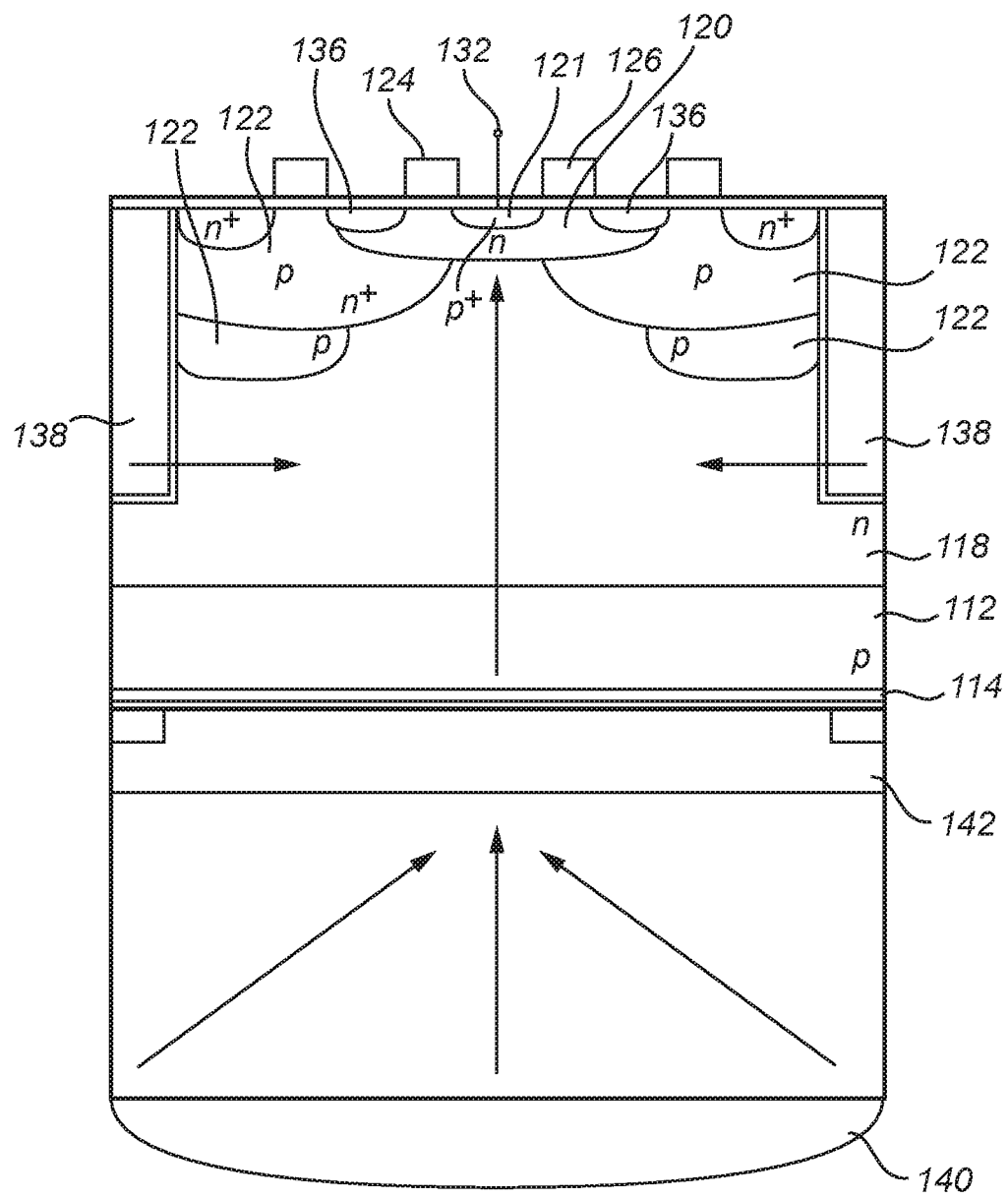
FIG. 8 is a schematic cross-sectional view of the pixel architecture for pixels of the image sensor, according to an example embodiment.

In FIG. 8, a pixel 110 is shown, wherein the pixel 110 is further provided with a filter 142. The filter 142 may be attached to the pixel 110 in front of the absorption layer 112, such that light incident on the pixel 110 will pass through the filter 142 before reaching the absorption layer 112. As shown in FIG. 8, the filter 142 may be arranged between the micro-lens 140 and the absorption layer 112. However, the filter 142 may alternatively be provided in an embodiment which does not include a micro-lens 140.

The filter 142 may be configured to selectively pass a wavelength or range of wavelengths to the absorption layer 112. Thus, light that may interfere with desired imaging by the image sensor 100 may be filtered out by the filter 142.

The filter 142 may for instance be configured to pass a wavelength of light used in pulsed light emitted for a TOF sensing application. According to an alternative, the filter 142 may be configured to pass a wavelength of light corresponding to a fluorescence wavelength, such that the image sensor 100 is specifically adapted to do fluorescence measurements.

The filter 142 may be an interference filter. For instance, the filter 142 may be a Fabry-Pérot filter.

The pixels 110 may all be configured to detect a common wavelength or range of wavelengths. Thus, identical filters 142 may be arranged in front of each pixel 110. According to an embodiment, a common filter 142 may be arranged in front of the entire array of pixels 110.

According to an alternative, pixels 110 may be provided with different filters 142, such that different wavelengths may be detected by different pixels 110. This may be used e.g. for imaging using a spectral resolution. In such case, the filters 142 may be produced to form different filters 142 in front of different pixels 110.

In the above, the present disclosure has mainly been described with reference to a limited number of examples. However, as is readily appreciated by a person skilled in the art, other examples than the ones disclosed above are equally possible within the scope of the present disclosure, as defined by the appended claims.

For instance, it should be realized that the optional features described in relation to FIGS. 5-8 may be used in different combinations than what is illustrated and discussed above. For instance, although the pixels 110 are illustrated to include a pinned storage node 136 in FIGS. 7-8, the pixels 110 may include an electric lens and/or a micro-lens without having a pinned storage node 136.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A pixel architecture for detection of incident light, the pixel architecture comprising:
    an absorption layer configured to extend in a first plane, facilitate back-side illumination, generate charges in response to incident light on an interface of the absorption layer; and to transport charges in a direction perpendicular to the first plane;
    a semiconductor charge-transport layer that extends in a second plane parallel to the first plane and that is configured to receive generated charges from the absorption layer and to transport the generated charges through the charge-transport layer, wherein the semiconductor charge-transport layer comprises:
    a bias region;
    a charge-dispatch region associated with the bias region that forms a dedicated region in a lateral direction parallel to the second plane of the charge-transport layer;
    a charge node; and
    one or more doped regions, wherein the one or more doped regions and the bias region have a different bias and are biased differently from a bulk substrate of the semiconductor charge-transport layer, wherein the one or more doped regions include a plurality of discrete implant regions at different depths within the semiconductor charge-transport layer that have different lateral lengths;
    an electric connection connecting to the bias region for providing a selectable bias voltage to the bias region; and
    at least one transfer gate associated with an area adjoining to the charge-dispatch region in the lateral direction,
    wherein the different bias between the doped regions and the bias region facilitate transport of the generated charges towards the charge-dispatch region, and together with the at least one transfer gate facilitate control of a transfer of charges from the charge-dispatch region in the lateral direction to the charge node.

2. The pixel architecture according to claim 1, wherein the bias region is formed by a doped implant in the semiconductor charge-transport layer, wherein the bias region is doped with a same charge carrier type as the one or more doped regions and a doping concentration of the bias region is higher than a doping concentration of the one or more doped regions.

3. The pixel architecture according to claim 1, wherein a bulk substrate of the absorption layer forms a depleted region.

4. The pixel architecture according to claim 1, wherein a plurality of doped regions are arranged in the semiconductor charge-transport layer on opposite sides in relation to a lateral extension of the charge-dispatch region, wherein a distance between doped regions on opposite sides of charge-dispatch region is smaller closer to a surface of the semiconductor charge-transport layer facing away from the absorption layer, such that a doped region forms a terrace-type structure in the semiconductor charge-transport layer.

5. The pixel architecture according to claim 1, further comprising a plurality of bias regions in the dedicated region and a plurality of electric connections for individually connecting to each of the bias regions for providing a selectable bias voltage to each of the bias regions, wherein the at least one transfer gate is associated with an area adjoining a bias region at an edge of the dedicated region.

6. The pixel architecture according to claim 5, wherein each of the plurality of bias regions is formed by an individually doped implant in the semiconductor charge-transport layer and wherein areas between adjacent bias regions are connected to an external structure for shaping an electric field in the dedicated region.

7. The pixel architecture according to claim 1, further comprising a plurality of transfer gates, each associated with different areas adjoining to the bias region in the lateral direction and associated with different charge nodes for controlling transfer of charges from the charge-dispatch region in the lateral direction to the corresponding charge node.

8. The pixel architecture according to claim 1, wherein the absorption layer is formed by a different material than the semiconductor charge-transport layer.

9. The pixel architecture according to claim 1, further comprising an electric lens for forming an electric field in the semiconductor charge-transport layer for driving transport of the generated charges in a lateral direction in the semiconductor charge-transport layer towards the charge-dispatch region.

10. The pixel architecture according to claim 1, further comprising an integrated optical micro-lens arranged in front of the absorption layer and configured to receive incident light and focus light towards a center of the absorption layer.

11. The pixel architecture according to claim 1, further comprising an integrated Fabry-Pérot filter, which is configured to selectively pass a wavelength range of incident light to reach the absorption layer.

12. An image sensor comprising:
an array of pixels, each having a pixel architecture comprising:
an absorption layer configured to extend in a first plane, facilitate back-side illumination, generate charges in response to incident light on an interface of the absorption layer and to transport charges in a direction perpendicular to the first plane;
a semiconductor charge-transport layer that extends in a second plane parallel to the first plane and that is configured to receive generated charges from the absorption layer and to transport the generated charges through the charge-transport layer, wherein the semiconductor charge-transport layer comprises:
a bias region;
a charge-dispatch region associated with the bias region that forms a dedicated region in a lateral direction parallel to the second plane of the charge-transport layer;
a charge node; and
one or more doped regions, wherein the one or more doped regions and the bias region have a different bias and are biased differently from a bulk substrate of the semiconductor charge-transport layer, wherein the one or more doped regions include a plurality of discrete implant regions at different depths within the semiconductor charge-transport layer that have different lateral lengths;
an electric connection connecting to the bias region for providing a selectable bias voltage to the bias region; and
at least one transfer gate associated with an area adjoining to the charge-dispatch region in the lateral direction,
wherein the different bias between the doped regions and the bias region facilitate transport of the generated charges towards the charge-dispatch region, and together with the at least one transfer gate facilitate control of a transfer of charges from the charge-dispatch region in the lateral direction to the charge node; and
a control unit configured to provide control signals for controlling transfer of charges from the charge-dispatch region to the charge node of each pixel in the array of pixels.

13. The image sensor according to claim 12, wherein each pixel is configured to receive incident light from a pulsed light reflected by a target sample for generating charges, wherein each pixel comprises a first and a second transfer gate associated with a first and a second charge node, respectively, and wherein the control unit is configured to synchronize transfer of charges to the first and the second transfer gate, respectively, with the pulsed light such that a ratio of charges in the first and second charge nodes forms a measure of a distance to the target sample.

14. The image sensor according to claim 13, wherein the control unit is configured to synchronize transfer of charges to the first and the second transfer gates with a sequence of light pulses for lock-in sensing.

15. The image sensor according to claim 12, wherein the control unit is configured to control reset of a given pixel and reading of a first voltage level from a floating diffusion node followed by transfer of charges from the charge node to the floating diffusion node and reading of a second voltage level from the floating diffusion node for enabling correlated double sampling.

16. The image sensor according to claim 12, wherein the bias region is formed by a doped implant in the semiconductor charge-transport layer, wherein the bias region is doped with a same charge carrier type as the one or more doped regions and a doping concentration of the bias region is higher than a doping concentration of the one or more doped regions.

17. The image sensor according to claim 12, wherein the bulk substrate of the absorption layer forms a depleted region.

18. The image sensor according to claim 12, wherein a plurality of doped regions are arranged in the semiconductor charge-transport layer on opposite sides in relation to a lateral extension of the charge-dispatch region, wherein a distance between doped regions on opposite sides of charge-dispatch region is smaller closer to a surface of the semiconductor charge-transport layer facing away from the absorption layer, such that a doped region forms a terrace-type structure in the semiconductor charge-transport layer.

19. The image sensor according to claim 12, wherein the bias region is formed by an individually doped implant in the charge-transport layer.

20. The image sensor according to claim 12, wherein the absorption layer is formed by a different material than the charge-transport layer.

* * * * *